US007850022B2

(12) United States Patent
Fulmer

(10) Patent No.: US 7,850,022 B2
(45) Date of Patent: Dec. 14, 2010

(54) ADJUSTABLE SHELF FOR STORING ELECTRONIC DEVICES

(75) Inventor: Keith J. Fulmer, Grasonville, MD (US)

(73) Assignee: Video Mount Products, Stevensville, MD (US)

( * ) Notice: Subject to any disclaimer, the term of this patent is extended or adjusted under 35 U.S.C. 154(b) by 582 days.

(21) Appl. No.: 11/808,178

(22) Filed: Jun. 7, 2007

(65) Prior Publication Data

US 2008/0302742 A1  Dec. 11, 2008

(51) Int. Cl.
*A47F 5/00* (2006.01)
(52) U.S. Cl. .................................. 211/184; 211/186
(58) Field of Classification Search ............. 211/184, 211/41.12, 43, 59.2, 59.3, 59.4, 175, 189, 211/26, 11, 126.13, 202; 108/60, 61
See application file for complete search history.

(56) References Cited

U.S. PATENT DOCUMENTS

| | | | | |
|---|---|---|---|---|
| 525,186 A * | 8/1894 | Bowley | .................... | 206/335 |
| 1,358,853 A * | 11/1920 | Hruska | .................... | 211/43 |
| 1,747,496 A * | 2/1930 | Vanderveld | .................... | 312/140 |
| 1,875,288 A * | 8/1932 | Welk et al. | .................... | 211/43 |
| 2,104,864 A * | 1/1938 | Isberg | .................... | 211/43 |
| 2,264,086 A * | 11/1941 | Landau | .................... | 211/43 |
| 3,138,262 A * | 6/1964 | Anders | .................... | 211/43 |
| 3,142,384 A * | 7/1964 | Fridolph | .................... | 211/43 |
| 3,199,683 A * | 8/1965 | Graswich | .................... | 211/41.1 |
| 3,513,983 A * | 5/1970 | Kellogg | .................... | 211/43 |
| 4,566,054 A | 1/1986 | Shimoda et al. | | |
| 4,615,276 A * | 10/1986 | Garabedian | .................... | 108/61 |
| 4,867,318 A * | 9/1989 | Robson | .................... | 211/40 |
| 5,038,689 A * | 8/1991 | Duffy | .................... | 108/108 |
| 5,762,208 A | 6/1998 | Yeh | | |
| 5,794,794 A * | 8/1998 | Hull | .................... | 211/26 |
| 5,860,535 A * | 1/1999 | Brown | .................... | 211/42 |
| 5,971,173 A * | 10/1999 | Valiulis et al. | .................... | 211/184 |
| 6,234,328 B1 * | 5/2001 | Mason | .................... | 211/90.02 |
| 6,561,602 B1 * | 5/2003 | Sevier et al. | .................... | 312/265.1 |
| 6,669,029 B1 | 12/2003 | Beane | | |
| 6,705,477 B1 * | 3/2004 | Narkis et al. | .................... | 211/153 |
| 6,739,463 B2 * | 5/2004 | Wishart et al. | .................... | 211/189 |
| 6,889,854 B2 | 5/2005 | Burke | | |
| 6,913,386 B2 * | 7/2005 | Maher et al. | .................... | 383/38 |
| 2003/0121874 A1 * | 7/2003 | Koester et al. | .................... | 211/187 |
| 2005/0224437 A1 * | 10/2005 | Lee | .................... | 211/184 |
| 2006/0043031 A1 * | 3/2006 | Rinderer | .................... | 211/26 |
| 2006/0278596 A1 * | 12/2006 | Parshad | .................... | 211/184 |

\* cited by examiner

*Primary Examiner*—Darnell M Jayne
*Assistant Examiner*—Devin Barnett
(74) *Attorney, Agent, or Firm*—Nixon & Vanderhye PC

(57) ABSTRACT

An adjustable shelf assembly, which may be a rack mount shelf, that can adjustably accommodate a plurality of electronic devices. In an example embodiment, the shelf assembly is designed to hold several electronic devices, oriented vertically. This is accomplished by providing a shelf with multiple adjustments, including partitions to adjust the width left to right of each receiver receptacle. In addition, a rear slide mechanism adjusts front to back to accommodate the depth of the electronic devices.

18 Claims, 4 Drawing Sheets

ADJUSTABLE SHELF FOR STORING ELECTRONIC DEVICES

BACKGROUND AND SUMMARY OF THE INVENTION

The present invention relates to a shelf assembly for efficiently storing plural electronic devices, such as satellite receivers.

Entertainment venues such as sports bars typically have a number of television screens for simultaneously displaying multiple sporting events. Each such display screen must thus have independent electronic control devices and satellite or cable feed and all of these electronic devices need to be stored in an efficient and effective manner.

The invention provides an adjustable shelf assembly, which may be a rack mount shelf, that can adjustably accommodate a plurality of electronic devices. In an example embodiment, the shelf assembly is designed to hold several electronic devices, oriented vertically. As such, a single adjustable rack mount shelf can replace the need to sacrifice eight rack shelves and sixteen rack shelf spaces for the mounting of eight electronic devices, such as satellite receivers. This is accomplished by providing a shelf with multiple adjustments, including partitions to adjust the width left to right of each receiver receptacle. In addition, a rear slide mechanism adjusts front to back to accommodate the depth of the electronic devices. The unit may also include front and top anti-roll bars that prevent the electronic devices from moving forward or tipping back if the equipment rack is moved or jostled or the devices themselves are handled, such as having buttons pushed, cables plugged in, and the like.

Thus, the invention may be embodied in an adjustable shelf assembly comprising: a shelf member having a forward edge, a rear edge, and first and second side edges, a top surface and a bottom surface; a plurality of divider members disposed generally parallel to and between said side edges to partition said top surface of said shelf member between said side edges, each said divider member being engaged and selectively secured in position with respect to said shelf member by first and second clamp mechanisms, whereby when said clamp mechanisms are released, said respective divider member can be slid laterally substantially continuously along at least a portion of the distance between said side walls, and wherein when said clamp mechanisms are clampingly engaged with the shelf member, said respective divider member is clamped to said shelf member so as to be substantially locked in position to define, with an adjacent divider member, a receptacle for an electronic device of a prescribed width.

DETAILED DESCRIPTION OF THE INVENTION

It is conventional to place electronic components horizontally on a shelf, perhaps stacking one component upon another to provide ready access and control. However, this means that a shelf can only hold one or a limited number of electronic devices. Most electronic devices, however, can be oriented vertically without compromising their performance, and secure vertical storage allows for more compact placement of electronic devices whereby a number of electronic devices can be stored on a single shelf, compactly and economically. However, electronic devices may be of different heights (widths in a vertical orientation) and must necessarily be mounted securely so that they will not fall forwardly or to the side, risking damage to the component or possible injury to the user. The invention provides a shelf, e.g., for a rack, with multiple adjustments and optional front roll bars to allow plural electronic devices of potentially varying sizes to be accommodated and securely held in position.

Thus, the shelf assembly is in the form of a shelf member with several laterally adjustable partitions or dividers that can be selectively moved into position and locked to define a receptacle of a particular width. The depth of the receptacles can also be adjusted. In an example embodiment that adjustment is uniform for a plurality of or all components.

Figure 1:
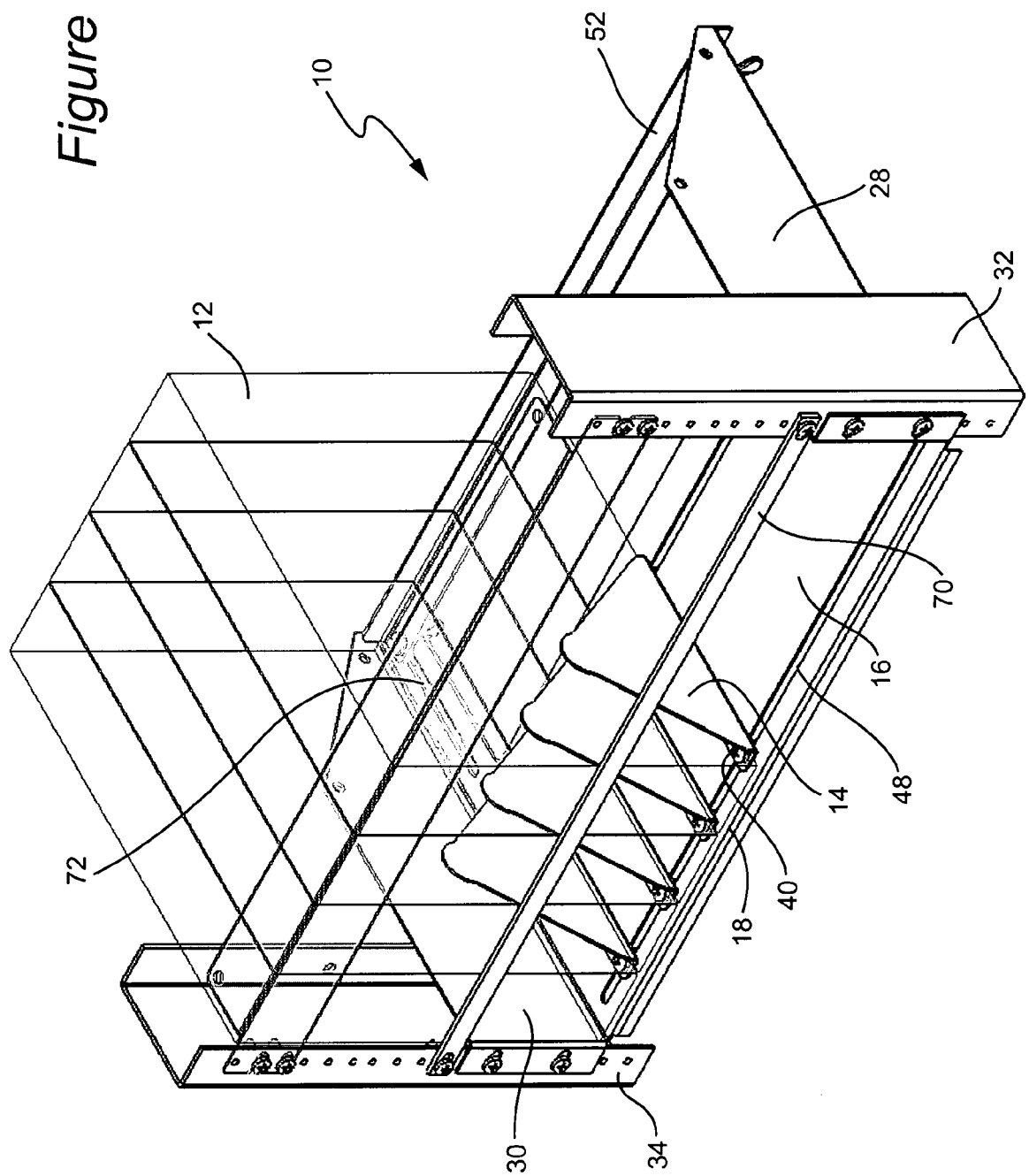
FIG. 1 is a perspective view from the front, above and right of an adjustable shelf assembly embodying the invention.
Figure 2:
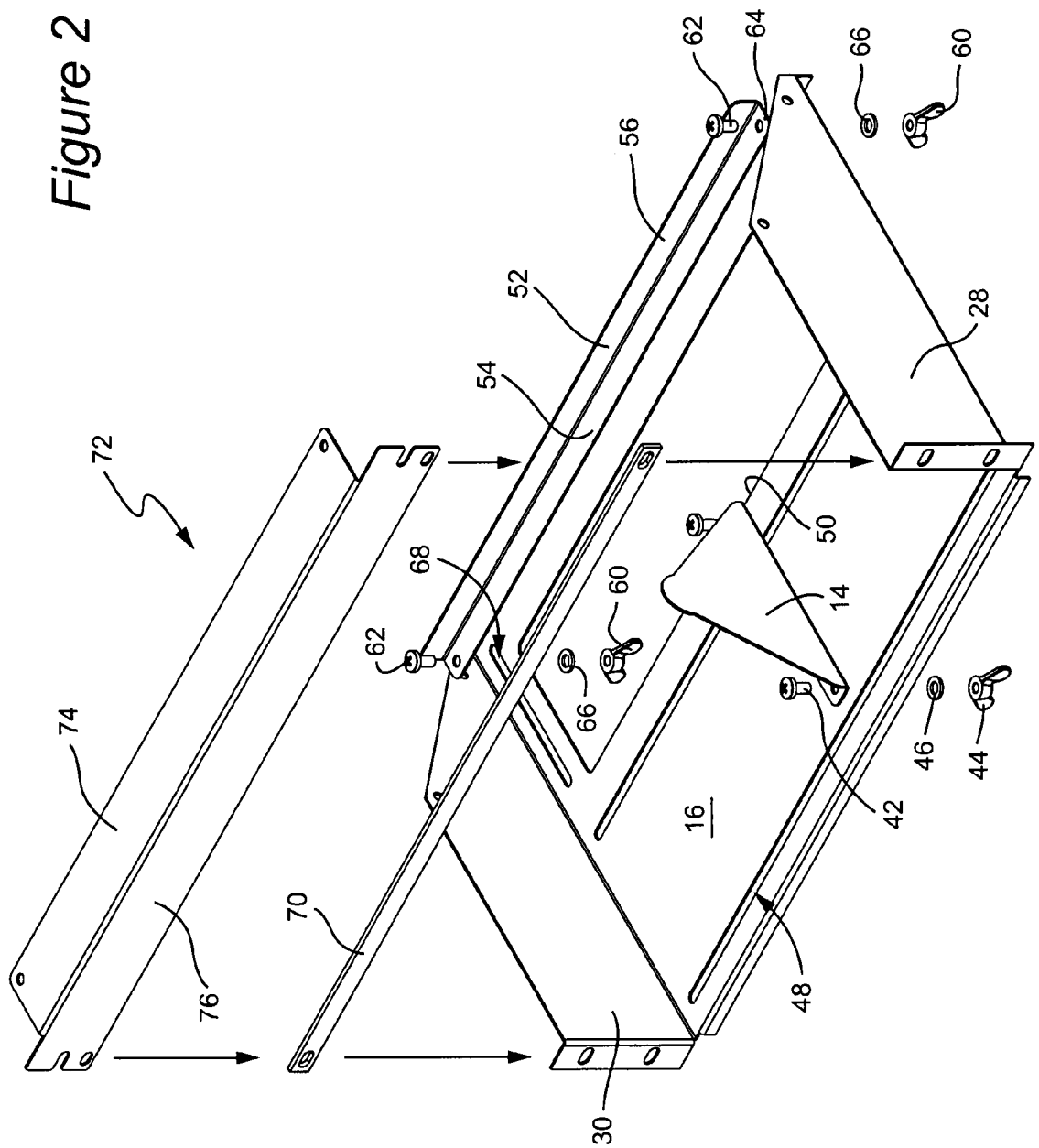
FIG. 2 is an exploded perspective view from the front, top and right, revealing details of the shelf assembly according to an example embodiment of the invention.
Figure 3:
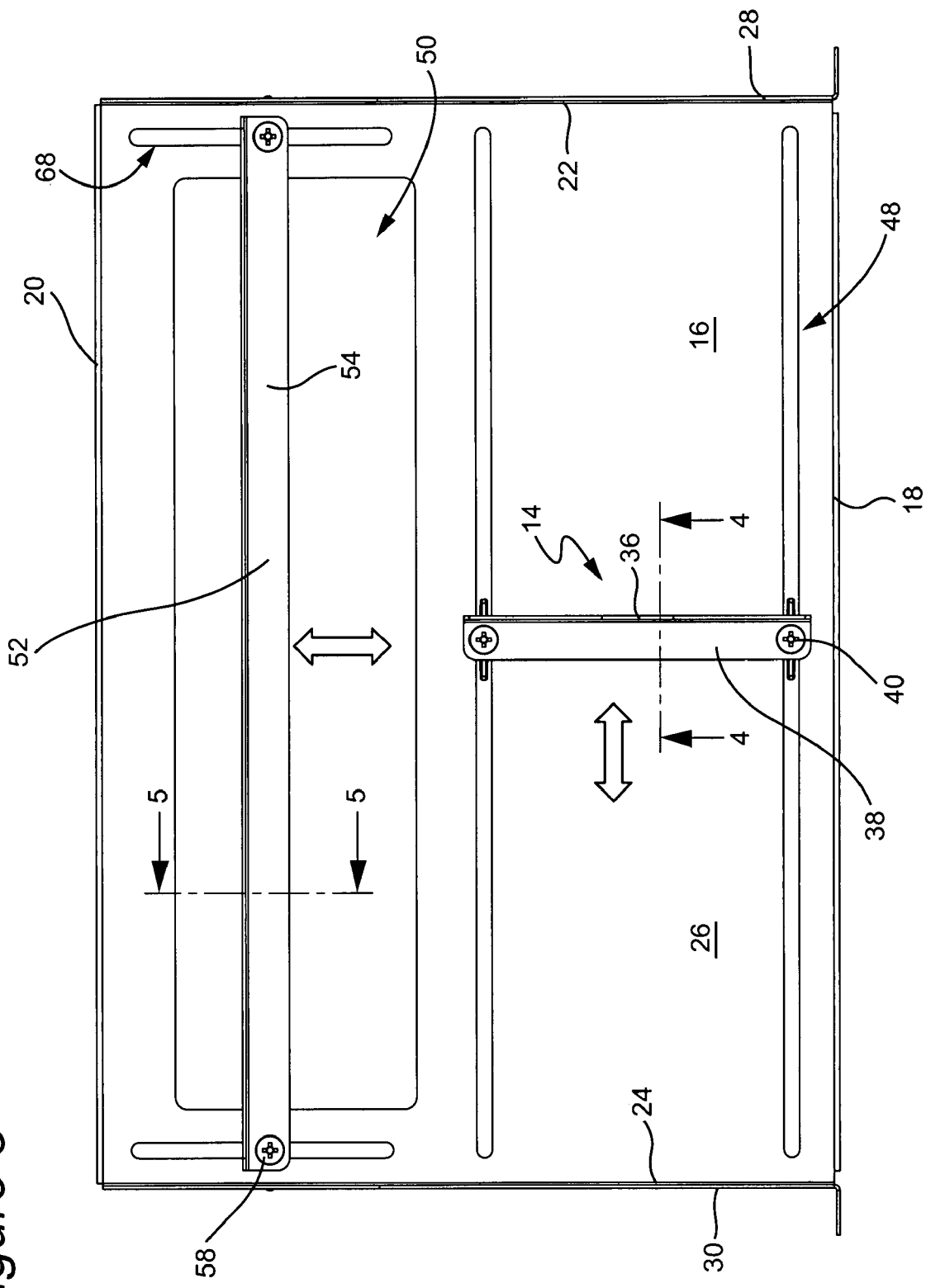
FIG. 3 is a top plan view of the shelf member according to an example embodiment of the invention.
Figure 5:
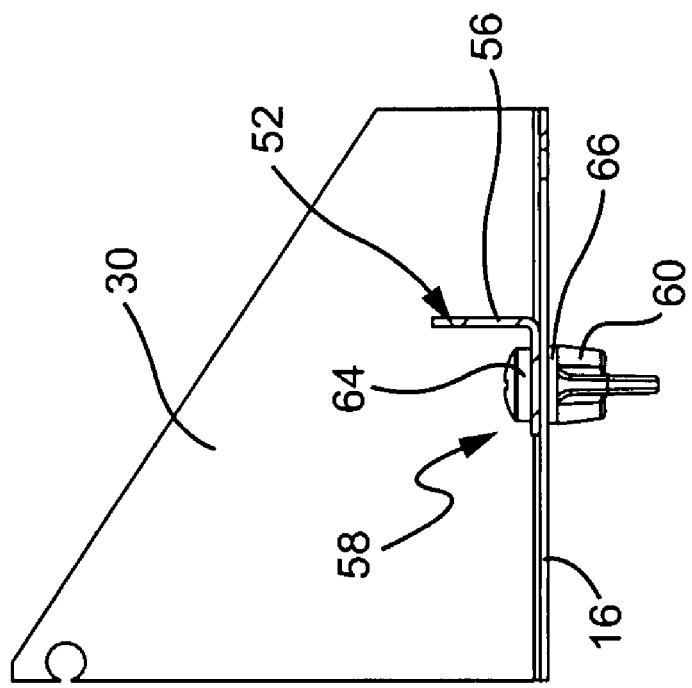
FIG. 5 is a cross-sectional view taken along line 5-5 of FIG. 3.
Figure 4:
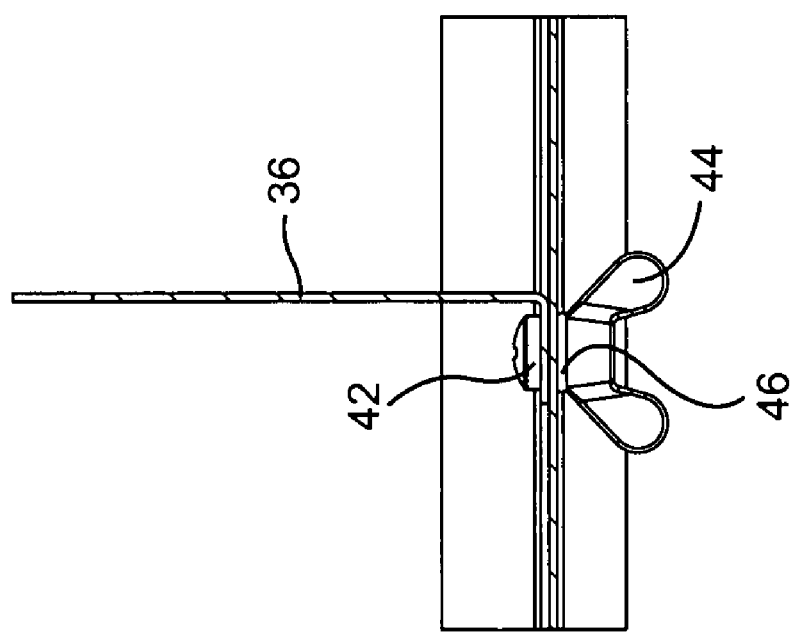
FIG. 4 is a cross-sectional view taken along line 4-4 of FIG. 3.

FIG. 1 is a perspective view of an example embodiment of a shelf assembly 10 embodying the invention, wherein a plurality of electronic devices 12, such as satellite receivers, are schematically depicted as mounted in a vertical orientation in respective receptacles defined by divider members 14 that are adjustably positioned on a shelf member 16. The illustrated shelf assembly can be provided as a single shelf suitably mounted to a wall, or as one of a plurality of vertically spaced shelves mounted to a frame, depending upon the number of electronic devices needed for storage and access.

The adjustable shelf assembly of the illustrated embodiment includes a horizontally disposed shelf member 16 having a front edge 18, a rear edge 20, first and second side edges 22,24, a top surface 26 and a bottom surface. The shelf member 16 is adapted to support the weight of the electronic devices ultimately placed on the top surface 26 thereof and may be made from metal, wood, plastic, composite materials, etc. as deemed appropriate in terms of cost, aesthetics and strength.

Side walls define the lateral limits of the shelf. In the illustrated example embodiment, the side walls are side wall components 28,30 disposed to extend vertically upwardly from the side edges 22,24. The embodiment of FIG. 1 also includes first and second vertical frame components 32, 34 which may be provided in addition to or in lieu of the side wall components. In the illustrated embodiment, the frame components are provided independently of the side wall components and secured thereto at the front edge of the side wall components. However, as a further alternative, the vertical frames may be integrated with the side walls. As yet a further alternative, the shelf member may include frame components at all four corners, particularly if it is free standing. In the illustrated example, the rear edge of the shelf is adapted to be suitably secured to a vertical wall. As another alternative the shelf member may be disposed in a suitably sized and shaped receptacle or recess in a wall so that the function of the side wall components is provided by wall surfaces that surround the shelf and the function of the frame is provided by the corners of such recess. Thus, the side walls that are disposed to extend upwardly from the side edges of the shelf may be defined by a side wall component as illustrated in FIG. 1 or may be provided by a surrounding wall structure. Likewise, the vertical frames may be defined by frame components, as illustrated, or by an adjacent wall structure.

To define a plurality of receptacles, each for receiving a respective electronic device 12, a plurality of divider members 14 are disposed to extend upwardly from the top surface 26 of the shelf member 16. Each divider member thus includes a vertical portion 36 disposed in a plane generally parallel to the side edges 22,24 of the shelf member 16 and a horizontal portion defining at least one clamp tab or flange 38.

Each divider member 14 is secured with at least first and second clamp mechanisms 40 to the shelf member 16. In the illustrated embodiment, the clamp mechanisms 40 are comprised of bolts 42 that extend through clamp tab(s) 38 of each divider member 14 and are engaged with a respective nut 44 that is tightened to clamp, through washer 46, the divider member 14 to the shelf member 16. In the illustrated example, the nuts 44 are wing nuts so that they can be readily manually tightened and loosened to provide for quick release, adjustment and clamping of the respective divider member 14. The invention is not limited, however, to a nut and bolt clamp mechanism. Other known clamp mechanisms, such as spring loaded clamp mechanisms, that allow for selective release, slide and lock of the divider members may be used rather than the illustrated nut and bolt assembly.

To accommodate the clamping mechanism of the illustrated embodiment, the shelf member includes at least one slot 48 extending at least partly between the side edges 22,24 of the shelf member 16, to allow for continuous displacement and selectively clamping of the divider members 14 anywhere along the lateral length of the shelf member. In the illustrated embodiment, first and second parallel slots 48 are provided, one for each of the clamp mechanisms 40 and, disposed towards the front of the shelf member so that ventilation opening 50 that allows for air circulation and cooling of the electronic devices 12 can be defined in a more rear portion of the shelf member. Further, in the illustrated example, the lateral slots 48 extend substantially between the side edges of the shelf to accommodate substantially a full width for displacement of the divider member(s). In this regard, divider members may be provided at the lateral ends of slots 48 to effectively define side walls of the shelf assembly for engaging out-facing surfaces of electronic components adjacent the side edges of shelf member 16.

As noted above, to provide support to prevent tipping of the electronic devices, the divider members each have a vertical portion. In the illustrated example the divider members 14 are metal plates and for material, weight and cost savings, the vertical portions are generally triangular in form. It is to be understood, however, that the divider members may have shapes other than that illustrated, such as rectangular, semi-circular or some other geometric shape, without departing from the invention. Furthermore, although the divider member is illustrated as a metal plate structure, it is to be understood that further cost and weight savings may be realized by providing divider members as a peripheral wire or with material and weight saving holes therethrough. Providing a plate with clamp tab as illustrated, however, is presently preferred as providing a secure and stable support for the electronic device, while realizing manufacturing economies. Furthermore, while the clamp tab 38 is illustrated as extending along the entire longitudinal length of the vertical portion, it is to be understood that the clamp tab may be provided as discrete connector tab portions associated with the clamp members and thus provided only at spaced locations along the longitudinal length of the divider member.

To further provide for proper placement and secure retention of electronic devices on the shelf component, in an example embodiment of the invention, at least one depth stop 52 is provided for engaging a rear edge of the deepest of the electronic components or a plurality of the electronic components, if a plurality are of the same depth. The depth stop may be provided at a fixed location or, more preferably, in an example embodiment of the invention, is adjustable so as to selectively accommodate electronic devices of varying depth. Thus, in the illustrated embodiment, the depth stop is generally L-shaped including clamp tab(s) 54 for being selectively clamped to the shelf member 16 and a vertical portion 56 for limiting rearward movement of the respective electronic component. The depth stop 52 is selectively clamped to the shelf member with first and second clamped mechanisms 58. The depth stop need not be L-shaped along its entire length but may be provided essentially as a stop bar, comprising the vertical portion, with connector tabs located to accommodate the clamp mechanisms. In the illustrated embodiment, the clamp mechanisms comprise a nut 60 and bolt 62, the bolts extending through suitably disposed apertures 64 in the clamp tab(s) 54 and wherein selective tightening of the nut through washer 66 clamps the depth stop 52 in a desired position on the shelf member 16. In the illustrated embodiment, slots 68 are provided to extend along at least a portion of the shelf member between the rear edge 20 and the front edge 18 for accommodating the adjustable slide of the depth stop 52. In the illustrated embodiment, the slots 68 extend along only a part of the depth of the shelf as the electronic devices are expected to have a predictable minimum depth.

In the illustrated example embodiment, the unit also includes front and top anti-roll bars 70,72 that prevent the electronic devices 12 from moving forward or tipping back if the equipment rack is moved or jostled or if the devices themselves are handled, such as buttons pushed and cables plugged.

In the illustrated example embodiment, the front anti-roll bar 70 extends between the right and left rails or frames 32,34 of a rack. In the alternative, the front anti-roll bar may be mounted to extend between the vertical side wall 28,30 components or to extend between walls disposed on either side of the shelf unit. In the illustrated embodiment, the front anti-roll bar 70 is simply in the form an elongated plate to prevent downward and forward displacement of the electronic components 12.

A top anti-roll bar 72 is also illustrated and includes a horizontal tab 74 and a vertical tab 76, the vertical tab 76 being secured to the right and left rails or frames 32,34 and the horizontal tab being disposed to overly the electronic devices 12 to thereby prevent rotation of the electronic devices upwardly and rearwardly or downwardly and forwardly. Again, the top anti-roll bar 72 may either be mounted to extend between respective walls on each lateral side of the shelf or between two rails, as illustrated, where the shelf is provided as a part of a shelf system or rack.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An adjustable shelf assembly comprising:
    a shelf member having a forward edge, a rear edge, and first and second side edges, a top surface and a bottom surface;
    a plurality of divider members disposed generally parallel to and between said side edges to partition said top surface of said shelf member between said side edges, each said divider member being engaged and selectively secured in position with respect to said shelf member by first and second clamp mechanisms, whereby when said clamp mechanisms are released, said respective divider member can be slid laterally substantially continuously along at least a portion of the distance between said side edges, and wherein when said clamp mechanisms are clampingly engaged with the shelf member, said respective divider member is clamped to said shelf member so as to be substantially locked in position to define, with an adjacent divider member, a receptacle for an electronic device of a prescribed width, wherein said first side edge is fixed to a first side wall member disposed to extend at least vertically upwardly from said first side edge, said first side wall member extending along substantially the entire first side edge, whereby a receptacle for an electronic device of a prescribed width is defined between said first side wall member and a next adjacent one of said divider members, and said second side edge is fixed to a second side wall member disposed to extend at least vertically upwardly from said second side edge, said second side wall member extending along substantially the entire second side edge, further comprising first and second vertical frame components secured to front edges of said side wall members and extending vertically upwardly with respect thereto, and further comprising at least one anti-roll bar selectively fixed with respect to said first and second side wall members and selectively fixed with respect to said shelf member, said at least one anti-roll bar being vertically spaced from said top surface of said shelf member, extending generally in parallel to said forward edge, and extending generally perpendicular to said divider members and to said first and second side wall members, wherein the at least one anti-roll bar includes an upper anti-roll bar having a horizontal part parallel to and in opposed facing relation to the top surface of the shelf member, having a width generally corresponding to a width of said shelf member and having a depth substantially less than a depth of said shelf member, said upper anti-roll bar being mounted so that it is vertically spaced from top ends of said first and second vertical frame components, so that it is vertically below said top ends, whereby the upper anti-roll bar engages a part of an upper surface of at least one electronic device disposed on said shelf member.

2. An adjustable shelf assembly as in claim 1, wherein each said divider member includes at least one clamping tab having a bore defined therethrough and said clamp mechanism comprises a bolt extending through said bore and a nut threaded to said bolt.

3. An adjustable shelf assembly as in claim 1, wherein said shelf member includes at least one lateral slot extending at least a part of a distance between said side edges and wherein said clamp mechanism extends through a clamping tab of the divider member and through said slot to selectively clamp said divider member to said shelf member.

4. An adjustable shelf assembly as in claim 3, wherein there are first and second slots.

5. An adjustable shelf assembly as in claim 4, wherein said slots extend substantially from one side edge to the other.

6. An adjustable shelf assembly as in claim 3, wherein said clamp mechanism comprises a bolt extending through said clamping tab and through said slot and a nut threaded to said bolt.

7. An adjustable shelf assembly as in claim 1, wherein each said divider member includes a first upstanding portion and a second horizontal tab portion, said horizontal tab portion being selectively clamped to said shelf member with said clamp mechanisms.

8. An adjustable shelf assembly as in claim 7, wherein said clamp mechanism comprises a bolt extending through said clamping tab and a nut threaded to said bolt.

9. An adjustable shelf assembly as in claim 1, further comprising a depth stop component extending along at least a part of a width of said shelf member, said depth stop including first and second clamp mechanisms for selectively locking said depth stop with respect to said shelf member to define a depth of at least one said receptacle for an electronic device.

10. An adjustable shelf assembly as in claim 9, further comprising a pair of slots extending at least a part of a distance between the front edge to the back edge of said shelf member, said clamp mechanisms of said depth stop each extending through said depth stop and a respective said slot.

11. An adjustable shelf assembly comprising:

a shelf member having a forward edge, a rear edge, and first and second side edges, a top surface and a bottom surface;

a plurality of divider members disposed generally parallel to and between said side edges to partition said top surface of said shelf member between said side edges, each said divider member being engaged and selectively secured in position with respect to said shelf member by first and second clamp mechanisms, whereby when said clamp mechanisms are released, said respective divider member can be slid laterally substantially continuously along at least a portion of the distance between said side edges, and wherein when said clamp mechanisms are clampingly engaged with the shelf member, said respective divider member is clamped to said shelf member so as to be substantially locked in position to define, with an adjacent divider member, a receptacle for an electronic device of a prescribed width, wherein said first side edge is fixed to a first side wall member disposed to extend at least vertically upwardly from said first side edge, said first side wall member extending along substantially the entire first side edge, and said second side edge is fixed to a second side wall member disposed to extend at least vertically upwardly from said second side edge, said second side wall member extending along substantially the entire second side edge, further comprising first and second vertical frame components secured to said side wall members and extending vertically upwardly with respect thereto, and further comprising an anti-roll bar fixed to said first and second vertical frame components, said anti-roll bar being vertically spaced from, so as to be vertically above, said top surface of said shelf member, said anti-roll bar being vertically spaced from, so as to be vertically below, top ends of said first and second vertical frame components, said anti-roll bar extending generally in parallel to said forward edge, and extending generally perpendicular to said divider members and to said first and second side wall members, wherein said anti-roll bar includes a horizontal part parallel to and in opposed facing relation to the top surface of the shelf member, having a width generally corresponding to a width of said shelf member and having a depth substantially less than a depth of said shelf member, whereby said anti-roll bar engages a part of an upper surface of at least one electronic device disposed on said shelf member.

12. An adjustable rack mount shelf as in claim 1, wherein there are plural anti-roll bars associated with each shelf member, at least one of said anti-roll bars being vertically spaced from a top edge of said divider members so as to be in a plane disposed vertically above said top edge of said divider members, each said anti-roll bar being selectively fixed to said first and second vertical frame components.

13. An adjustable shelf assembly as in claim 1, wherein said at least one anti-roll bar is secured to said first and second vertical frame components and wherein said at least one anti-roll bar is vertically spaced from, so as to be vertically below, top ends of said first and second vertical frame components.

14. An adjustable shelf assembly as in claim 11, wherein said anti-roll bar is L-shaped including said horizontal part parallel to and in opposed facing relation to the top surface of the shelf member and a vertical part parallel to the forward edge of the shelf member and perpendicular to the divider members, whereby the L-shaped anti-roll bar engages an upper, forward corner of at least one electronic device disposed on said shelf member.

15. An adjustable shelf assembly as in claim 1, wherein the upper anti-roll bar is L-shaped including said horizontal part parallel to and in opposed facing relation to the top surface of the shelf member and a vertical part parallel to the forward edge of the shelf member and perpendicular to the divider members, whereby the L-shaped anti-roll bar engages an upper, forward corner of at least one electronic device disposed on said shelf member.

16. An adjustable shelf assembly comprising:
a shelf member having a forward edge, a rear edge, and first and second side edges, a top surface and a bottom surface;
a plurality of divider members disposed generally parallel to and between said side edges to partition said top surface of said shelf member between said side edges, each said divider member being engaged and selectively secured in position with respect to said shelf member by first and second attachment mechanisms, wherein said respective divider member can be slid substantially continuously along at least a portion of the distance between said side edges, and wherein each said respective divider member defines, with an adjacent divider member, a receptacle for an electronic device of a prescribed width, wherein
said first side edge is fixed to a first side wall member disposed to extend at least vertically upwardly from said first side edge, said first side wall member extending along substantially the entire first side edge,
whereby a receptacle for an electronic device of a prescribed width is defined between said first side wall member and a next adjacent one of said divider members, and
said second side edge is fixed to a second side wall member disposed to extend at least vertically upwardly from said second side edge, said second side wall member extending along substantially the entire second side edge,
further comprising first and second vertical frame components secured to said side wall members and extending vertically upwardly with respect thereto, and
further comprising at least one anti-roll bar selectively fixed with respect to said first and second side wall members and selectively fixed with respect to said shelf member, said at least one anti-roll bar being vertically spaced from said top surface of said shelf member, extending generally in parallel to said forward edge, and extending generally perpendicular to said divider members and to said first and second side wall members, wherein the at least one anti-roll bar includes an upper anti-roll bar having a horizontal part parallel to and in opposed facing relation to the top surface of the shelf member, having a width generally corresponding to a width of said shelf member and having a depth substantially less than a depth of said shelf member, said upper anti-roll bar being mounted so that it is vertically spaced from top ends of said first and second vertical frame components, so that it is vertically below said top ends, whereby the upper anti-roll bar engages a part of an upper surface of at least one electronic device disposed on said shelf member.

17. An adjustable shelf assembly as in claim 16, wherein said shelf member includes at least one slot extending at least part of a distance between said side edges, and wherein said attachment mechanisms extend through said slot to clamp said divider member to said shelf member.

18. An adjustable shelf assembly as in claim 16, wherein the upper anti-roll bar is L-shaped including said horizontal part parallel to and in opposed facing relation to the top surface of the shelf member and a vertical part parallel to the forward edge of the shelf member and perpendicular to the divider members, whereby the L-shaped anti-roll bar engages an upper, forward corner of at least one electronic device disposed on said shelf member.

* * * * *